(12) United States Patent
Kawai et al.

(10) Patent No.: US 7,486,072 B2
(45) Date of Patent: Feb. 3, 2009

(54) PARALLEL MULTIPLE COIL MR SCANNING METHOD AND MRI APPARATUS WITH FLOW COMPENSATION IN A CALIBRATION SCAN INCLUDING A CALIBRATION OF A COIL SENSITIVITY OF EACH COIL

(75) Inventors: Hidenori Kawai, Tokyo (JP); Yoshikazu Ikezaki, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 11/534,140

(22) Filed: Sep. 21, 2006

(65) Prior Publication Data

US 2007/0075707 A1    Apr. 5, 2007

(30) Foreign Application Priority Data

Sep. 30, 2005    (JP)    ............................. 2005-287002

(51) Int. Cl.
*G01V 3/00* (2006.01)
*A61B 5/055* (2006.01)

(52) U.S. Cl. ................. 324/306; 324/307; 324/309; 324/318; 600/419; 600/422; 600/425; 600/427

(58) Field of Classification Search ......... 324/300–322; 600/407–435
See application file for complete search history.

(56) References Cited

U.S. PATENT DOCUMENTS

| | | | | |
|---|---|---|---|---|
| 4,947,120 A | * | 8/1990 | Frank | ......................... 324/309 |
| 5,565,776 A | * | 10/1996 | Kanazawa | ................... 324/306 |
| 5,810,727 A | * | 9/1998 | Groen | ........................ 600/410 |
| 6,259,940 B1 | | 7/2001 | Bernstein et al. | |
| 6,289,232 B1 | * | 9/2001 | Jakob et al. | ................. 600/410 |
| 6,408,201 B1 | * | 6/2002 | Foo et al. | ..................... 600/410 |
| 6,528,997 B2 | * | 3/2003 | Zhong et al. | ................ 324/307 |
| 6,781,375 B2 | | 8/2004 | Miyazaki et al. | |
| 6,842,000 B2 | * | 1/2005 | Norris et al. | ................ 324/309 |

(Continued)

FOREIGN PATENT DOCUMENTS

JP    11-318852    11/1999

(Continued)

OTHER PUBLICATIONS

Pruessmann et al.: "Sense: Sensitivity Encoding for Fast MRI," Magnetic Resonance in Medicine 42:952-962 (1999), pp. 952-962.

*Primary Examiner*—Brij Shrivastav
*Assistant Examiner*—Tiffany A Fetzner
(74) *Attorney, Agent, or Firm*—Armstrong Teasdale LLP

(57) ABSTRACT

The present invention provides an MR scanning method and an MRI apparatus for decreasing the artifacts while improving the signal from within the blood vessels in the parallel imaging. In the sequence for calibration data acquisition the, RF pulse of the flip angle and the slice gradient are applied, then the phase encoding pulse is applied. Thereafter the MR signal will be received while applying the read pulse with the flow compensation pulse (marked as hatch area). Using a sequence with the flow compensation added in the calibration scanning allows decreasing the artifacts caused by the blood stream. This also increased the signal from within the blood vessels, allowing improving the S/N ratio of the calibration data.

20 Claims, 3 Drawing Sheets

U.S. PATENT DOCUMENTS

| | | | |
|---|---|---|---|
| 7,064,547 B1 * | 6/2006 | King et al. | 324/309 |
| 7,078,899 B2 | 7/2006 | Dale et al. | |
| 7,084,626 B2 * | 8/2006 | Ma et al. | 324/307 |
| 2002/0032376 A1 * | 3/2002 | Miyazaki et al. | 600/410 |
| 2006/0164082 A1 * | 7/2006 | Foxall et al. | 324/306 |
| 2006/0176055 A1 | 8/2006 | Fukuta | |
| 2006/0244449 A1 * | 11/2006 | Muftuler et al. | 324/318 |

FOREIGN PATENT DOCUMENTS

| | | |
|---|---|---|
| JP | 2004-321791 | 11/2004 |

* cited by examiner

PARALLEL MULTIPLE COIL MR SCANNING METHOD AND MRI APPARATUS WITH FLOW COMPENSATION IN A CALIBRATION SCAN INCLUDING A CALIBRATION OF A COIL SENSITIVITY OF EACH COIL

CROSS REFERENCE TO RELATED APPLICATIONS

This application claims the benefit of Japanese Application No. 2005-287002 filed Sep. 30, 2005.

BACKGROUND OF THE INVENTION

The present invention relates to an MR (magnetic resonance) scanning method and an MRI (magnetic resonance imaging) apparatus, and more specifically to an MR scanning method and an MRI apparatus which may decrease artifacts while increasing a signal from within blood vessels in parallel imaging.

Conventionally there are known parallel imaging techniques referred to as SENSE and ASSET (see patent reference 1 and non-patent reference 1 for example).

On the other hand there is known a sequence with a flow compensation pulse added (see patent reference 2 for example).

[patent reference 1] Unexamined Patent Publication No. 2004-321791

[patent reference 2] Unexamined Patent Publication No. Hei 11(1999)-318852

[non patent reference 1] Klaas P. Pruessmann et al., "SENSE: Sensitivity Encoding for Fast MRI" Magnetic Resonance in Medicine 42 (1999) pp. 952-962

Conventionally, there has not been a sequence in a parallel imaging with the flow compensation pulse added.

This may cause a problem of arising some artifacts due to the blood stream or of decreasing signal from within the blood vessels.

SUMMARY OF THE INVENTION

Therefore, an object of the present invention is to provide an MR scanning method and an MRI apparatus, which allow decreasing artifacts and increasing signals from within the blood vessels in the parallel imaging.

In a first aspect, the present invention provides an MR scanning method comprising the step of using a sequence with a flow compensation pulse added in a calibration scan of a parallel imaging.

A composite image V can be yielded from the following complex number calculation, based on a sensitivity matrix S in which the sensitivity map s(coil) of each coil determined by the calibration data obtained in a calibration scan is sequentially listed, the image matrix A in which a complex number image a(coil) determined by the actual data obtained by the scan using every coil (a scan with the field of view narrowed in the direction of phase encoding) is sequentially listed:

$$V = (S^H \psi^{-1} S)^{-1} S^H \psi^{-1} A$$

where $S^H$ is a conjugate transpose of S. $\psi$ is a noise correlation matrix. When the noise correlation matrix is not used, $\psi$ is an identity matrix. This calculation will be performed for each pixel.

The above equation is disclosed in the above-cited non-patent reference 1 (Klaas P. Pruessmann et al., "SENSE: Sensitivity Encoding for Fast MRI" Magnetic Resonance in Medicine 42 (1999) pp. 952-962).

In the conventional calibration scan, since the phase shift due to the blood stream may be included in both the sensitivity matrix S and the image matrix A, the phase shift of both are added in the complex number calculation cited above, so that the phase is not reflected to the synthesized image V, causing some artifacts. Also this may decrease the signal from within the blood vessels, degrading the S/N ratio of the calibration data.

The MR scanning method according to the first aspect of the present invention, uses a sequence with the flow compensation pulse added in the calibration scan. This allows first-order phase shift due to the blood flow not to be included in the sensitivity matrix S. Thus only the phase of the image matrix A is reflected to the composed image V. In other words the phase is correctly reflected to the composite image V, allowing decreasing the artifacts. This also increases the signal from within the vessel, allowing improving the S/N ratio of the calibration data.

In a second aspect, the present invention provides an MR scanning method according to the first aspect, in which the sequence is a sequence for gradient echo system.

The MR scanning method according to the second aspect allows shortening the scanning time by using the sequence for gradient echo system.

In a third aspect, the present invention provides an MR scanning method according to the first or second aspect, in which the flow compensation pulse is added to the read gradient of the sequence.

The MR scanning method according to the third aspect, the influence by the blood stream may be suppressed by adding a flow compensation pulse to the read gradient.

In a fourth aspect, the present invention provides an MR scanning method according to the first or second aspect, in which the flow compensation pulse is added to the slice gradient of the sequence.

The MR scanning method according to the fourth aspect, the influence by the blood stream may be suppressed by adding a flow compensation pulse to the slice gradient.

In a fifth aspect, the present invention provides an MRI apparatus, which includes a plurality of coils; a calibration scanning means for collecting calibration data indicative of the sensitivity distribution of the coils by means of a sequence with a flow compensation pulse added; an actual scanning means for acquiring the actual data for each of the coils by scanning in the direction of phase encoding with the narrowed field of view; and a synthesizing means for generating a synthesized image by performing calculating so as to remove the folding in the direction of phase encode based on the actual data of each of the coils.

The MRI apparatus according to the fifth aspect suitably conducts the MR scanning method according to the first aspect.

In a sixth aspect, the present invention provides an MRI apparatus according to the fifth aspect, in which the sequence is a sequence for the gradient echo system.

The MRI apparatus according to the sixth aspect described above suitably conducts the MR scanning method according to the second aspect.

In a seventh aspect, the present invention provides an MRI apparatus according to the fifth or sixth aspect, in which the flow compensation pulse is added to the read gradient of the sequence.

The MRI apparatus according to the seventh aspect described above suitably conducts the MR scanning method according to the third aspect.

In an eighth aspect, the present invention provides an MRI apparatus according to the MR scanning method of the first or second aspect, in which the flow compensation pulse is added to the slice gradient of the sequence.

The MRI apparatus according to the eighth aspect described above may suitably conduct the MR scanning method according to the fourth aspect.

In accordance with the MR scanning method and the MRI apparatus of the present invention, the phases are correctly reflected into the composite image V to effectively decrease the artifacts. The present invention allows increasing the signal from within the blood vessel so as to improve the S/N ratio of the calibration data.

The MR scanning method and the MRI apparatus in accordance with the present invention can be used for capturing tomographic image of blood vessels.

Further objects and advantages of the present invention will be apparent from the following description of the preferred embodiments of the invention as illustrated in the accompanying drawings.

DETAILED DESCRIPTION OF THE INVENTION

The present invention will be described in greater details with reference to the preferred embodiment shown in the accompanying drawings. It should be understood that the preferred embodiment is not to be considered to limit the invention.

FIRST EMBODIMENT

Figure 1:
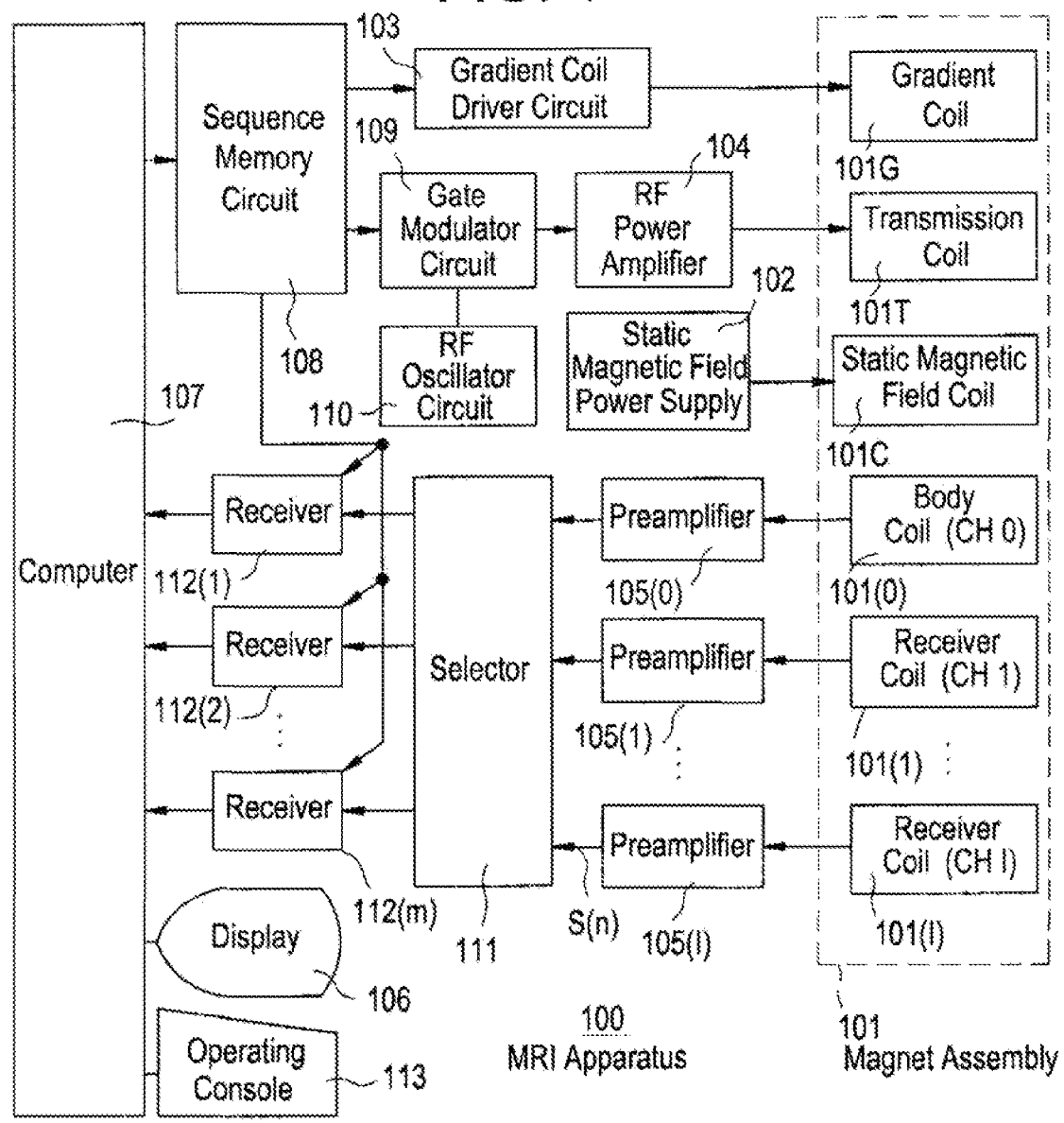
FIG. 1 shows a schematic block diagram indicating the MRI apparatus in accordance with the first preferred embodiment of the present invention.

FIG. 1 shows a schematic block diagram indicating an MRI apparatus 100 in accordance with the first preferred embodiment of the present invention.

In the MRI apparatus 100, the magnet assembly 101 has a center space (bore) into which a subject is carried, a static magnetic field coil 101C for applying a static magnetic field at a constant intensity to the subject, a gradient coil 101G for generating the gradient magnetic field in the x-, y-, and z-axis, a transmission coil 101T for providing RF pulses for exciting the spin of the atom within the subject, a body coil 101(0) for receiving the MR signals from the subject and receiver coils 101(1), ..., 101(I) of I channels. The static magnetic field coil 101C, the gradient coil 101G, the transmission coil 101T, the body coil 101(0), and the receiver coils 101(1), ..., 101(I) are placed surrounding the bore.

The static magnetic field coil 101C, gradient coil 101G, transmission coil 101T are connected to a static magnetic field power supply 102, a gradient coil driver circuit 103, and an RF power amplifier 104, respectively. The body coil 101 (0), receiver coils 101(1), ..., 101(I) are each connected to their respective preamplifiers 105(0), 105(1), ..., 105(I).

There are cases in which the body coil 101(0) is used for the transmission coil 101T.

A permanent magnet can be used instead of the static magnetic field coil 101C.

A sequence memory circuit 108, by following the instruction given by a computer 107, operates the gradient coil driver circuit 103 based on the stored pulse sequence to cause the gradient coil 101G to generate the gradient magnetic field, and also operates a gate modulator circuit 109 to cause the gate modulator circuit 109 to modulate the carrier output signal form an RF oscillator circuit 110 into a pulsive signal with a given timing, given envelope shape, and given phase, to add to the RF power amplifier 104 as the RF pulses, then the RF power amplifier 104 in turn amplifies the power of signal prior to applying to the transmission coil 101T.

A selector 111 transmits the MR signals received by the body coil 101(0), receiver coils 101(1), ..., 101(I) and amplified by the preamplifiers 105(0), 105(1), ..., 105(I) to the m receivers 112(1), 112(2), ..., 112($m$). This configuration is so as for the correspondence between the body coil 101(0), receiver coils 101(1), ..., 101(I) and the receivers 112(1), 112(2), ..., 112($m$) to be variable.

The receivers 112(1), 112(2), ..., 112(m) convert the MR signals into digital signals S(n) to input into the computer 107.

The computer 107 reads the digital signals from the receiver 112, and performs a processing on it to generate an MR image. The computer 107 in addition performs the versatile management of the system such as receiving the input information from an operating console 113.

A display 106 displays the images and messages.

Figure 2:
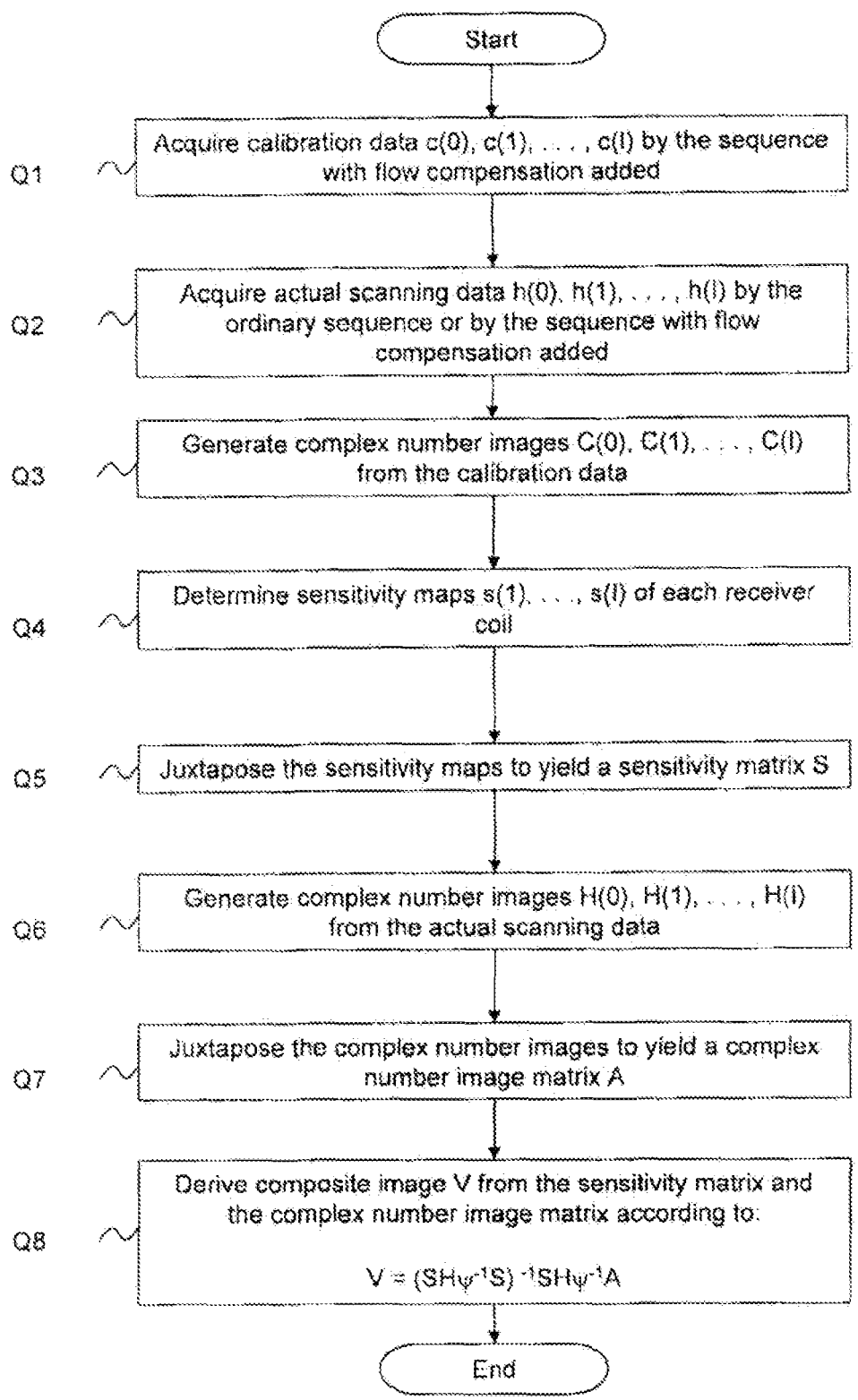
FIG. 2 shows a flow diagram indicating the MR scanning process in accordance with the first preferred embodiment of the present invention.

FIG. 2 shows a flow diagram indicating the MR scanning process.

In step Q1, MR signals from the subject are received in parallel by the body coil 101(0), receiver coils 101(1), ..., 101(I) in the sequence with the flow compensation added, in order to collect the calibration data c(0), c(1), ..., c(I).

Figure 3:
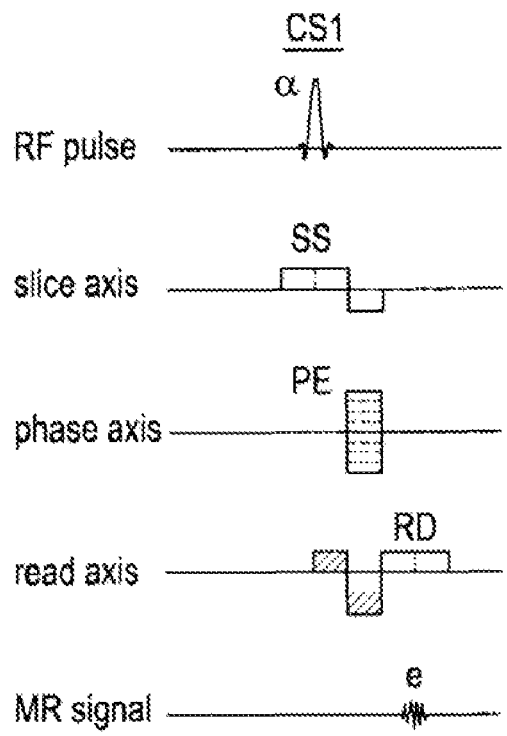
FIG. 3 shows a schematic diagram indicating the sequence for calibration data acquisition in accordance with the first preferred embodiment of the present invention.

FIG. 3 shows a schematic diagram indicating a sequence with the flow compensation added in accordance with the first preferred embodiment.

The sequence CS1 for calibration data acquisition applies an RF pulse α of the flip angle α along with the slice gradient SS, and applies the phase encoding pulse PE. Then MR signal e will be received while applying the read pulse RD with the flow compensation pulse added (marked as hatched area).

The combination of x-, y-, z-axis of the gradient coil 101G forms the slice axis, phase encoding axis, and read axis.

Now referring again to FIG. 2, in step Q2, MR signals from the subject are received in a conventional sequence in parallel by the receiver coils 101(1), ..., 101(I) to acquire the actual imaging data of each coil h(1), ..., h(I).

Then the MR scanning process terminates.

Thereafter, based on the calibration data c(0), c(1), ..., c(I) and the actual imaging data h(0), h(1), ..., h(I), a composite image V is generated for example by the following procedure.

In step Q3, complex number images C(0), C(1), ..., C(I) are generated from the calibration data c(0), c(1), ..., c(I), then the complex number images C(1), ..., C(I) for each receiver coil are divided by the complex number image C(0) of the body coil 101(0) to determine the sensitivity maps s(1), ..., s(I) of each receiver coil in step Q4. In step Q5, the sensitivity maps s(1) to S(I) are juxtaposed to yield a sensitivity matrix S.

In step Q6, complex number images H(1), ..., H(I) are generated from the actual imaging data h(1), ..., h(I), and the complex number images H(1), ..., H(I) are juxtaposed to yield a complex number image matrix A in step Q7.

In step Q8, the composite image V is derived from the sensitivity matrix S and the complex number image matrix A. according to the following equation.

$$V=(S^H\psi^{-1}S)^{-1}S^H\psi^{-1}A$$

In the MRI apparatus 100 in accordance with the first preferred embodiment, a sequence with the flow compensation is used in the calibration scan, so that the phase shift caused by the blood stream will not be included in the sensitivity matrix S. This indicates that only the phase of the complex number image matrix A is reflected to the composite image V. In other words, the phase is correctly reflected to the composite image V, allowing decreasing the artifacts. In addition, the signal from within the blood vessel will increase, allowing improving the S/N ratio of the calibration data.

SECOND EMBODIMENT

Figure 4:
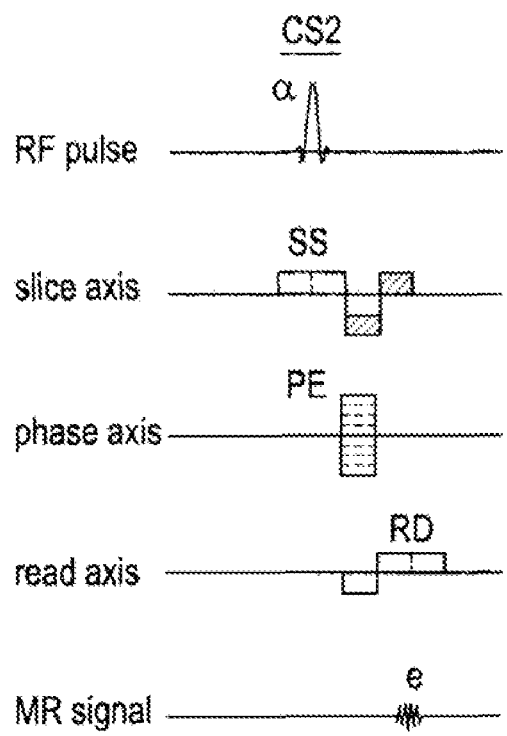
FIG. 4 shows a schematic diagram indicating the sequence for calibration data acquisition in accordance with the second preferred embodiment of the present invention.

FIG. 4 shows a schematic diagram indicating a sequence with the flow compensation added in accordance with the second preferred embodiment of the present invention.

In the sequence CS2 for calibration data acquisition, the RF pulse $\alpha$ of the flip angle $\alpha$ and the slice gradient SS with the flow compensation pulse (marked as hatched area) added are applied, then the phase encoding pulse PE is applied. Thereafter, MR signal e will be received while applying the read pulse RD.

THIRD EMBODIMENT

The body coil 101(0) is not used for receiving. The receiver coils 101(1), ..., 101(I) are used for yielding the calibration data c(1), ..., c(I), and the sensitivity maps s(1), ..., s(I) of each coil may be determined based on the sum of square method.

FOURTH EMBODIMENT

The sequence CS1 for calibration data acquisition shown in FIG. 3 and the sequence CS2 for calibration data acquisition shown in FIG. 4 are both sequences for gradient echo system. However a sequence for spin echo system can be used for acquiring the calibration data c(0), c(1), ..., c(I).

FIFTH EMBODIMENT

The flow compensation pulse can be added to the sequence of actual imaging data acquisition.

Many widely different embodiments of the invention may be configured without departing from the spirit and the scope of the present invention. It should be understood that the present invention is not limited to the specific embodiments described in the specification, except as defined in the appended claims.

The invention claimed is:

1. An MR scanning method for increasing a signal level within a blood vessel during an MR imaging scan, said method comprising:
performing a calibration scan of a parallel imaging device that includes a plurality of coils, the calibration scan having a blood flow compensation pulse added therein, the calibration scan including calculating a coil sensitivity of each coil, from which a first-order phase shift due to blood flow within the blood vessel has been removed; and
acquiring actual MR imaging data of each coil within the plurality of coils, using an actual imaging scan sequence after completion of the calibration scan.

2. An MR scanning method according to claim 1, wherein the imaging scan sequence is a sequence for use by a gradient echo system.

3. An MR scanning method according to claim 1, wherein the blood flow compensation pulse is added to a read gradient of the imaging scan sequence.

4. An MR scanning method according to claim 1, wherein the blood flow compensation pulse is added to a slice gradient of the imaging scan sequence.

5. An MR scanning method according to claim 1, wherein the imaging scan sequence is a sequence utilized by a gradient echo system.

6. An MR scanning method according to claim 1, wherein the blood is a flow compensation pulse is added to the actual imaging scan sequence rather than to the calibration scan.

7. An MR scanning method according to claim 1, sensitivity maps of each of said plurality of coils is determined based on a sum of square method.

8. An MRI apparatus configured for increasing a signal level with in a blood vessel during an MR imaging scan, said MRI apparatus comprising:
a plurality of coils;
a calibration scanning device configured to collect calibration data via a calibration scan having a blood flow compensation pulse added therein, the calibration data being indicative of a sensitivity distribution of said plurality of coils;
an actual scanning device configured to acquire actual MR data for each of said plurality of coils via an actual imaging scan sequence upon completion of the calibration scan by scanning in a direction of phase encoding with a narrowed field of view, wherein said calibration scanning device is further configured to measure a coil sensitivity of each of said plurality of coils prior to said actual scanning device acquiring actual data of each of said plurality of coils such that a first order phase shift due to blood flow within the blood vessel is not included in the coil sensitivity measurements; and.
a synthesizing device configured to generate a synthesized image by performing a calculation so as to remove a folding in the direction of phase encoding based on the calibration data and the actual data of each of said plurality of coils.

9. An MRI apparatus according to claim 8, wherein the imaging scan sequence is a sequence for use by a gradient echo system.

10. An MRI apparatus according to claim 8, wherein the blood flow compensation pulse is added to a read gradient of the imaging scan sequence.

11. An MRI apparatus according to claim 8, wherein the blood flow compensation pulse is added to a slice gradient of the imaging scan sequence.

12. An MRI apparatus according to claim 8, wherein the imaging scan sequence is a sequence utilized by a gradient echo system.

13. An MRI apparatus according to claim 8, wherein the blood is a flow compensation pulse is added to the actual imaging scan sequence rather than to the calibration scan.

14. An MRI apparatus according to claim 8, wherein sensitivity maps of each of said plurality of coils is determined based on a sum of square method.

15. A scanning apparatus configured for increasing a signal level within a blood vessel during an MR imaging scan, said scanning apparatus comprising:

a plurality of coils;

a calibration scanning device configured to collect calibration data via a calibration scan having a blood flow compensation pulse added therein, the calibration data being indicative of a sensitivity distribution of said plurality of coils;

an actual scanning device configured to acquire actual MR data for each of said plurality of coils via an actual imaging scan sequence upon completion of the calibration scan by scanning in a direction of phase encoding with a narrowed field of view, wherein said calibration scanning device is further configured to measure a coil sensitivity of each of said plurality of coils prior to said actual scanning device acquiring actual data of each of said plurality of coils such that a first order phase shift due to blood flow within the blood vessel is not included in the coil sensitivity measurements; and.

a synthesizing device configured to generate a synthesized image by performing a calculation so as to remove a folding in the direction of phase encoding based on the calibration data and the actual data of each of said plurality of coils.

16. A scanning apparatus according to claim 15, wherein the imaging scan sequence is a sequence utilized by a gradient echo system.

17. A scanning apparatus according to claim 15, wherein the blood flow compensation pulse is added to a read gradient of the imaging scan sequence.

18. A scanning apparatus according to claim 15, wherein the blood flow compensation pulse is added to a slice gradient of the imaging scan sequence.

19. A scanning apparatus according to claim 15, wherein the imaging scan sequence is a sequence utilized by a spin echo system.

20. A scanning apparatus according to claim 15, wherein the blood is a flow compensation pulse is added to the actual imaging scan sequence rather than to the calibration scan.

* * * * *